US010700282B2

(12) United States Patent
Rafailovich et al.

(10) Patent No.: US 10,700,282 B2
(45) Date of Patent: Jun. 30, 2020

(54) SYNTHESIS AND INCORPORATION OF GRAPHENE AND/OR METALLIZED OR METAL OXIDE-MODIFIED GRAPHENE TO IMPROVE ORGANIC SOLAR CELLS AND HYDROGEN FUEL CELLS

(71) Applicant: THE RESEARCH FOUNDATION FOR THE STATE UNIVERSITY OF NEW YORK, Albany, NY (US)

(72) Inventors: Miriam Rafailovich, Plainview, NY (US); Rebecca Isseroff, West Hempstead, NY (US); Hongfei Li, Sound Beach, NY (US); Andrew Chen, North Woodmere, NY (US); Sneha Chittabathini, Hicksville, NY (US); Alexandra Tse, North Woodmere, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 153 days.

(21) Appl. No.: 15/127,108

(22) PCT Filed: Mar. 20, 2015

(86) PCT No.: PCT/US2015/021800
§ 371 (c)(1),
(2) Date: Sep. 19, 2016

(87) PCT Pub. No.: WO2015/143353
PCT Pub. Date: Sep. 24, 2015

(65) Prior Publication Data

US 2017/0179393 A1  Jun. 22, 2017
US 2019/0189924 A9  Jun. 20, 2019

Related U.S. Application Data

(63) Continuation-in-part of application No. 14/092,230, filed on Nov. 27, 2013, now Pat. No. 9,401,489.
(Continued)

(51) Int. Cl.
*H01B 1/24* (2006.01)
*H01L 51/00* (2006.01)
(Continued)

(52) U.S. Cl.
CPC .......... *H01L 51/0036* (2013.01); *H01B 1/24* (2013.01); *H01L 51/0003* (2013.01);
(Continued)

(58) Field of Classification Search
CPC .. H01B 1/00; H01B 1/24; H01L 51/00; H01L 51/5012; H01L 51/5048; H01L 51/5088
See application file for complete search history.

(56) References Cited

U.S. PATENT DOCUMENTS

2007/0131915 A1  6/2007  Stankovich
2011/0184088 A1  7/2011  Lohmeijer

FOREIGN PATENT DOCUMENTS

CN  103022357  4/2013

OTHER PUBLICATIONS

Liu et al "Polymer photovoltaic cells based on solution-processable graphene and P3HT", Adv. Funct. Mater. 2009, 19, 894-904. (Year: 2009).*

(Continued)

*Primary Examiner* — Mark Kopec
(74) *Attorney, Agent, or Firm* — Hoffmann & Baron, LLP

(57) ABSTRACT

A composition used to form the active layer of a solar cell or hydrogen fuel cell that comprises, consists of or consists essentially of a homogenous dispersion, poly(3-hexylthio- (Continued)

phene-2,5-diyl) (P3HT) and 1-(3-methoxycarbonyl)propyl-1-phenyl[6,6]$C_{61}$ (PCBM). The homogenous dispersion comprises, consists of or consists essentially of graphene oxide (GO) or reduced graphene oxide (RGO) and sulfonated polystyrene (PSS) or para-methoxy-N-methylamphetamine (PMMA). The GO or RGO can be functionalized with a metal, preferably gold (Au), platinum (Pt), palladium (Pd) or ferric oxide ($Fe_2O_3$).

15 Claims, 12 Drawing Sheets

Related U.S. Application Data

(60) Provisional application No. 61/968,022, filed on Mar. 20, 2014, provisional application No. 61/730,291, filed on Nov. 27, 2012.

(51) Int. Cl.
| | |
|---|---|
| *H01L 51/42* | (2006.01) |
| *H01M 4/86* | (2006.01) |
| *H01M 4/90* | (2006.01) |
| *H01M 4/92* | (2006.01) |

(52) U.S. Cl.
CPC ........ *H01L 51/004* (2013.01); *H01L 51/0035* (2013.01); *H01L 51/0047* (2013.01); *H01L 51/4253* (2013.01); *H01M 4/8652* (2013.01); *H01M 4/9008* (2013.01); *H01M 4/9016* (2013.01); *H01M 4/9075* (2013.01); *H01M 4/925* (2013.01); *H01L 2251/301* (2013.01); *Y02E 10/549* (2013.01)

(56) References Cited

OTHER PUBLICATIONS

Chuang et al "Gold nanoparticle-graphene oxide nanocomposites that enhance the device performance of polymer solar cells", Journal of Nanomaterials, vol. 2014, Article ID 736879, 12 pages. (Year: 2014).*

Singh et al "Graphene based materials: Past, present and future", Progress in Materials Scince 56 (2011) 1178-1271. (Year: 2011).*

Isseroff et al., "Increasing Polymer Solar Cell Active Layer Efficiency and Organization by Adding Gold-Functionalized Reduced Graphene Oxide", MRS Proceedings, vol. 1500, 2013.

Hou et al., "Active Layer Materials for Organic Solar Cells", Organic Solar Cells, pp. 1-27; 2013.

Pan et al., "Graphene-Based Functional Materials for Organic Solar Cells [Invited]", Optical Materials Express, vol. 2, No. 6, pp. 1-11; 2012.

Chuang et al., "Gold Nanoparticle-Graphene Oxide Nanocomposites That Enhance the Device Performance of Polymer Solar Cells", Journal of Nanomaterials, vol. 2014, pp. 1-12; 2014.

Lee et al., "Flexible Organic Solar Cells Composed of P3HT: PCBM Using Chemically Doped Graphene Electrodes", Nanotechnology 23 344013, pp. 1-6; 2012.

Kim et al., "Photocrosslinkable Polythiophenes for Efficient, Thermally Stable, Organic Photovoltaics", Adv. Funct. Mater, vol. 19, pp. 2273-2281; 2009.

Xu et al., "Polymer Photovoltaic Devices with Transparent Graphene Electrodes Produced by Spin-Casting", Carbon, vol. 48, pp. 3293-3311; 2010.

Lu et al., "Morphological Characterization of a Low-Bandgap Crystalline Polymer: PCBM Bulk Heterojunction Solar Cells", Adv. Energy Mater. XX, pp. 1-9; 2011.

Jenna deBoisblanc, "Synthesis and Characterization of P3HT: PCBM Organic Solar Cells", Senior Thesis, pp. 1-44; 2010, Advisors: David Tannenbaum and Alma Zook.

Weihau Ge, "An Overview on P3HT: PCBM, the Most Efficient Organic Cell Material So Far", Solid State Physics II; Spring 2009, Instructor: Elbio Dagatto, University of Tennessee.

Eda et al., "Chemicall Derived Graphene Oxide: Towards Large-Area Thin-Film Electronics and Optoelectronics", Adv. Mater., vol. 22, pp. 2392-2415; 2010.

"Ultraviolet-Ozone Surface Treatment", Three Bond Technical News 17, Mar. 20, 1987.

\* cited by examiner

SYNTHESIS AND INCORPORATION OF GRAPHENE AND/OR METALLIZED OR METAL OXIDE-MODIFIED GRAPHENE TO IMPROVE ORGANIC SOLAR CELLS AND HYDROGEN FUEL CELLS

This application claims priority from international patent application No. PCT/US15/21800 (filed Apr. 10, 2015), which application claims benefit of application Ser. No. 61/968,022 (filed Mar. 20, 2014), and this application claims CIP priority from application Ser. No. 14/092,230 (filed Nov. 27, 2013, now U.S. Pat. No. 9,401,489), which application claims benefit of application Ser. No. 61/730,291 (filed Nov. 27, 2012), the contents of which are incorporated herein in their entirety.

FIELD OF THE INVENTION

The present invention is an improved polymer composition for solar cells and fuel cells. In particular, the present invention relates to polymer compositions that incorporate graphene and metallized or metal oxide-modified graphene to significantly improve the performance of organic polymer solar cells (also referred to herein as "solar cells") and proton exchange membrane fuel cells (also referred to herein as "hydrogenfuel cells" or "fuel cells").

BACKGROUND OF INVENTION

Organic solar cells and fuel cells that are currently being used are comprised of expensive polymers and are inefficient because much of the energy is lost in the production process. A solar cell (also referred to herein as a "photovoltaic cell") is any device that directly converts the energy light (i.e., light energy or photons) into electrical energy through the process of photovoltaics, which is also referred to as the "photovoltaic effect." A solar cell is a specialized semiconductor diode that converts visible light into direct current (DC) electricity. Some photovoltaic cells convert infrared (IR) or ultraviolet (UV) radiation into DC. A photovoltaic module is a packaged, connected assembly of solar cells. A solar panel is a set of solar photovoltaic modules electrically connected and mounted on a supporting structure. The majority of solar modules use wafer-based crystalline silicon cells or thin-film cells based on cadmium telluride or silicon. Most solar modules are rigid, but semi-flexible ones are available, based on thin-film cells.

A common characteristic of both the small molecules and polymers used in photovoltaics is that they all have large conjugated systems. When these materials absorb a photon, an excited state is created and confined to a molecule or a region of a polymer chain. The excited state can be regarded as an electron-hole pair bound together by electrostatic interactions, i.e. excitons. In photovoltaic cells, excitons are broken up into free electron-hole pairs by effective fields. The effective fields are set up by creating a heterojunction between two dissimilar materials. Effective fields break up excitons by causing the electron to fall from the conduction band of the absorber to the conduction band of the acceptor molecule. For the heterojunction to function, the acceptor material must have a conduction band edge that is lower than that of the absorber material.

Currently, most commercial solar cells are made from a refined, highly purified silicon crystal, similar to the material used in the manufacture of integrated circuits and computer chips (wafer silicon). The high cost of these silicon solar cells and their complex production process has generated interest in developing alternative photovoltaic technologies such as polymer solar cells.

A polymer solar cell is a type of flexible solar cell made with polymer chains formed from large molecules with repeating structural units that produce electricity from sunlight by the photovoltaic effect. Polymer solar cells include organic solar cells (also called "plastic solar cells"). They are one type of thin film solar cell; others include the currently more stable amorphous silicon solar cell. Polymer solar cell technology is relatively new and is currently being very actively researched.

Compared to silicon-based devices, polymer solar cells are lightweight, potentially disposable and inexpensive to fabricate, flexible, customizable and they have lower potential for negative environmental impact. The major disadvantage of polymer solar cells is that they offer about one-third of the efficiency of hard materials. They are also relatively unstable toward photochemical degradation. For these reasons, despite continuing advances in semiconducting polymers, the vast majority of solar cells rely on inorganic materials.

Organic polymer solar cells ("OPSCs") differ from inorganic semiconductor solar cells in that they do not rely on the large built-in electric field of a PN junction (i.e., the boundary or interface between two types of semiconductor material, p-type and n-type, inside a single crystal of semiconductor) to separate the electrons and holes created when photons are absorbed. The active region of an organic device consists of two materials, one which acts as an electron donor and the other as an acceptor. When a photon is converted into an electron hole pair, typically in the donor material, the charges tend to remain bound in the form of an exciton and are separated when the exciton diffuses to the donor-acceptor interface. The short exciton diffusion lengths of most polymer systems tend to limit the efficiency of such devices.

A typical bulk heterojunction solar cell consists of an anode, followed by a hole-transporting layer, then the active layer, followed by the cathode. Typically, the anode and cathode are composed of indium tin oxide and aluminum, respectively. The hole-transporting layer is composed of two ionomers; the negatively-charged sodium polystyrene sulfonate ("PSS"), and the positively-charged poly(3,4-ethylenedioxythiophene) ("PEDOT").

An organic photovoltaic ("OPV") cell is composed of a film of organic photovoltaic active layer, sandwiched between a transparent electrode and a metal electrode. Typically, the active layer of a polymer solar cell ("PSC") device is composed of a blend film of conjugated polymer (as electron donor) and a small molecular acceptor. The conjugated polymer donor and the fullerene derivative acceptor are the key photovoltaic materials for high performance PSCs. Identifying the ideal properties and selecting photovoltaic materials with these ideal properties are important factors in photovoltaic materials design.

In bulk heterojunction polymer solar cells, light generates excitons. Subsequent charge separation in the interface between an electron donor and acceptor blend within the device's active layer. These charges then transport to the device's electrodes where the charges flow outside the cell, perform work and then re-enter the device on the opposite side. The cell's efficiency is limited by several factors, especially non-geminate recombination. Hole mobility leads to faster conduction across the active layer.

Attempts have been made using various approaches for integrating graphene into solar cells. In some cases, a multi-layer graphene was used as an electrode and in another case a thin layer of UV-Ozone-treated gold was placed onto a multi-layer graphene to make an anode. Another attempt was made using amino acid glycine as an environmentally friendly reducing reagent for the synthesis of gold nanoparticles-graphene oxide ("AuNP-GO") nanocomposites, which were then used in organic photovoltaic cells ("OPVs"). However, Raman spectroscopy showed that the glycine only reduced the Au but not the graphene oxide to graphene. Hence, the Au-graphene oxide was incorporated into the OPVs but not the graphene. In another attempt, GO and AuNP-GO solutions were "spincoated" onto indium-tin-oxide ("ITO") glass substrates, which were then used as a layer in a solar cell.

The performance of any type of solar battery is closely dependent on the conductivity of the electrode material and the adhesion of the electrode to the solar cell film. It has recently been proposed to use graphene and graphene oxide for the cathode and anode respectively since the two materials have appropriate work functions for the hole and the electron, respectively, and are resistant to oxidation. Adhesion of the graphene materials to the polymer films, though, still poses a problem. The polymer surface of the OPSC is hydrophobic and, hence, not amenable to any water-lift off technique for processing or plating. Spin coating is problematic since hydrophobic organic solvents sometimes used to disperse the graphene also dissolve the underlying polymer film and disturb the surface properties. Chemical vapor deposition of graphene at 1000° C. also degrades the underlying active polymer layer. Therefore, there is a need for a method for easily and economically incorporate graphene in a polymer layer. There is also a need for a polymer solar cell that can generate electricity more efficiently than the polymer solar cells now being used.

SUMMARY OF THE INVENTION

In accordance with the present invention, a composition used to form the active layer of a solar cell or hydrogen fuel cell is provided. The composition comprises, consists of or consists essentially of a homogeneous dispersion, poly(3-hexylthiophene-2,5-diyl) (P3HT) and 1-(3-methoxycarbonyl)propyl-1-phenyl[6,6]$C_{61}$ (PCBM). The homogeneous dispersion comprises, consists of or consists essentially of graphene oxide (GO) or reduced graphene oxide (RGO) and a polymer not miscilbe with P3HT, preferably styrenic polymers, acrylic polymers, carbonates, olephins or polyelectrolyte polymers, most preferably sulfonated polystyrene (PSS). The GO or RGO can be functionalized with a metal, preferably gold (Au), platinum (Pt), palladium (Pd) or ferric oxide $Fe_2O_3$. The weight ratio of GO or RGO to the polymer not miscilbe with P3HT, or metal functionalized GO or RGO to the polymer not miscilbe with P3HT, in the homogeneous dispersion can be from 0.25:20 to 8:20, preferably from 0.5:20 to 4:20. The weight ratio of GO or RGO to P3HT and PCBM in the composition can be from 0.25:20 to 8:20, preferably from 0.5:20 to 4:20. The composition is used to form the active layer of a solar cell or hydrogen fuel cell using well know methods, such as spin casting.

The composition can include about 25-40 wt. % P3HT, or the composition can include about 25-40 wt. % PCBM or the composition can include about 25-40 wt. % of the polymer not miscilbe with P3HT or the dispersion, wherein the wt. % is based on the total weight of the polymer not miscilbe with P3HT or the dispersion, P3HT and PCBM in the composition. In a preferred embodiment, the composition includes about 25-40 wt. % P3HT, about 25-40 wt. % PCBM and about 25-40 wt. % PSS, wherein the wt. % is based on the total weight of the polymer not miscilbe with P3HT or the dispersion, P3HT and PCBM in the composition.

In a second embodiment, the composition for an active layer of a solar cell or a hydrogen fuel cell is provided. The composition comprises, consists of or consists essentially of a homogeneous dispersion, poly(3-hexylthiophene-2,5-diyl) (P3HT) and 1-(3-methoxycarbonyl)propyl-1-phenyl[6,6] $C_{61}$ (PCBM). The homogeneous dispersion comprises, consists of or consists essentially of graphene oxide (GO) or reduced graphene oxide (RGO) and polysulfonated styrene (PSS) or para-methoxy-N-methylamphetamine (PMMA). The GO or RGO can be functionalized with a metal, preferably gold (Au), platinum (Pt) or palladium (Pd). Preferably, the GO or RGO is functionalized with gold (Au), platinum (Pt), palladium (Pd) or ferric oxide ($Fe_2O_3$). The weight ratio of GO or RGO to PSS or PMMA in the homogeneous dispersion can be from 0.5:20 to 4:20. The GO or RGO is functionalized with gold (Au), platinum (Pt), palladium (Pd) or ferric oxide ($Fe_2O_3$). The ratio of GO or RGO to P3HT and PCBM in the composition can be from 0.25:20 to 8:20, preferably from 0.5:20 to 4:20.

A third embodiment of the present invention is a method of attaching reduced graphene oxide and/or graphene oxide to a polymer layer. The method comprising, consisting of or consisting essentially of: forming a polymer layer having a hydrophobic, exterior surface; subjecting the hydrophobic, exterior surface of the polymer layer to ultraviolet/ozone (UV/$O_3$) exposure to change the hydrophobic, exterior surface to a hydrophilic, exterior surface; and applying reduced graphene oxide and/or graphene oxide to the hydrophilic surface of the polymer layer. The UV/$O_3$ exposure allows the reduced graphene oxide to be more easily applied to the polymer surface by reducing the contact angle of the exterior surface of the polymer layer, preferably from more than 70 degrees to less than 60 degrees and more preferably from more than 80 degrees to less than 50 degrees and most preferably from more than 90 degrees to less than 40 degrees.

The polymer layer is preferably a poly-3-hexyl thiophene ("P3HT") and phenyl-$C_{61}$-butyric acid methyl ester ("PCBM") copolymer blend ("P3HT:PCBM"). However, the polymer layer can also be polymethylmethacrylate ("PMMA") or any photoactive polymer known to produce excitons or have a photovoltaic response when exposed to the solar light spectrum. The polymer layer can be a single polymer or a multi-polymer blend with or without a charge carrier secondary component such as PCBM or graphene. The P3HT:PCBM blend has a P3HT to PCBM ratio of 20:1, more preferably 10:1 and most preferably 1:1.

The exterior surface of the polymer layer is exposed to UV/$O_3$ for a duration of from 30 seconds to one hour, preferably from 1 to 20 minutes and more preferably from 5 to 10 minutes and most preferably for 7 to 8 minutes. The UV light ranges from 100-400 nm, preferably 150-250 nm. A wavelength of 185 nm will produce approximately 0.2% ozone by weight. The dosage level is fixed by the manufacturers of the UV/$O_3$ generator and may vary from model to model. The dosage a polymer surface receives is determined in part by the contact angle with the surface. The minimum time of UV/$O_3$ exposure is the shortest time required to reduce the water contact angle on the surface of the polymer layer to approximately 60 degrees or less, more preferably 40 degrees or less, in order to make the surface hydrophilic and water processable. The exposure time can vary from polymer to polymer, depending on its degree of sensitivity to the UV/ozone radiation, which is ionizing, breaking polymer chain bonds and producing a high energy polar surface.

The reduced graphene oxide and/or graphene oxide can be in a hydrophilic solution or in a hydrophilic suspension. Preferred hydrophilic solutions comprise, consist of or consist essentially of graphene and/or graphene oxide and water, ethanol, ethanol-water mixtures, and/or dilute NaOH solutions. The preferred solution is ethanol-water. Preferred hydrophilic suspensions comprise, consist of or consist essentially of water, ethanol, ethanol-water mixtures, graphene oxide, dilute NaOH solutions and/or chlorobenzene. The preferred suspension is an alcohol-water solvent with a range of 10 vol. % to 90 vol. % alcohol and 90 vol. % to 10 vol. % $H_2O$, most preferably 25 vol. % alcohol and 75 vol. % $H_2O$. The preferred alcohol is ethanol or methanol. The hydrophilic reduced graphene oxide and/or graphene oxide solutions and suspensions preferably include gold particles, most preferably from $AuCl_4$. As used herein, all percentages of compositions are expressed as volume percent (vol. %) unless expressly identified otherwise.

The reduced graphene oxide or graphene oxide, in a solution or in a suspension, can be applied to the outer surface of the polymer layer by various coating, spray coating and electrostatic deposition methods, but the preferred method is spin coating. A thin film can also be applied to the polymer layer from the air-water interface of a Langmuir-Blodgett trough.

The composition can include about 25-40 wt. % P3HT, or the composition can include about 25-40 wt. % PCBM or the composition can include about 25-40 wt. % PMMA, wherein the wt. % is based on the total weight of PSS or PMMA, P3HT and PCBM in the composition. In a preferred embodiment, the composition includes about 25-40 wt. % P3HT, about 25-40 wt. % PCBM and about 25-40 wt. % PSS or PMMA, wherein the wt. % is based on the total weight of PSS or PMMA, P3HT and PCBM in the composition.

Another embodiment is a method for making the composition that forms the active layer of a solar cell or hydrogen fuel cell. The method comprises, consists of or consists essentially of the steps of: (1) forming a homogeneous dispersion comprising GO or RGO and a polymer not miscilbe with P3HT, preferably PSS or PMMA; (2) adding P3HT to the homogeneous dispersion to form a first mixture; (3) mixing the first mixture; (4) adding PCBM to the first mixture to form a second mixture; and (5) mixing the second mixture to form the composition. The composition comprises, consists of or consists essentially of about 25-40 wt. % homogeneous dispersion or PSS or PMMA, about 25-40 wt. % P3HT and about 25-40 wt. % PCBM, wherein the wt. % is based on the total weight of the homogeneous dispersion or PSS or PMMA, P3HT and PCBM.

The GO or RGO can be functionalized with a metal, preferably gold (Au), platinum (Pt), palladium (Pd) or ferric oxide ($Fe_2O_3$). The weight ratio of GO or RGO to homogeneous dispersion or PSS or PMMA can be from 0.25:20 to 8:20, preferably from 0.5:20 to 4:20. The weight ratio of metal-GO or metal-RGO to homogeneous dispersion or PSS or PMMA can be from 0.25:20 to 8:20, preferably from 0.5:20 to 4:20.

BRIEF DESCRIPTION OF THE FIGURES

The preferred embodiments of the organic polymer compositions for solar cells and fuel cells of the present invention, as well as other objects, features and advantages of this invention, will be apparent from the accompanying drawings wherein.

DETAILED DESCRIPTION OF THE INVENTION

The present invention optimizes the power conversion efficiency of organic polymer solar cells and fuel cells by incorporating graphene oxide ("GO") and reduced graphene oxide ("RGO") into the polymer compositions that are used to form the active layer of a solar cell or fuel cell. The addition of graphene oxide and reduced graphene oxide organizes the polymer structure of the composition, thereby increasing its performance. By organizing the structure and increasing the area where electrons can be generated, the graphene oxide and reduced graphene oxide improve the efficiency of solar cells and fuel cells that include the composition. The compositions create a usable organic polymer solar cell that can deliver significant energy production without the high costs of solar-grade silicon. In addition, the compositions can be used to increase the power output of a Proton Exchange Membrane Fuel Cell ("PEMFC").

Figure 1:
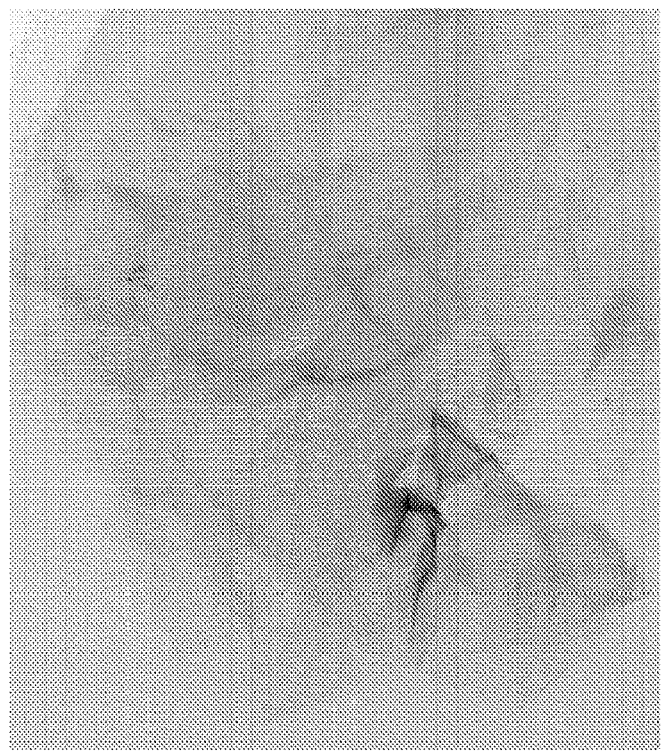
FIG. 1 is a TEM image of a synthesized graphene sheets studded with gold nanoparticles.

It has been found that the addition of graphene and metal or metal oxide-modified graphene to the active layer can significantly improve the performance of organic solar cells. The addition works both in the case of binary blends with PCBM (the fullerene derivative [6,6]-phenyl-C61-butyric acid methyl ester) and polymer, as well as tertiary or multi-polymer blends with PCBM. As little as 0.1% graphene and metal or metal oxide-modified graphene added to the PCBM is sufficient for observation of this effect, while increasing this ratio increases the performance enhancement. Furthermore, they can be applied as thin films to NAFION® (a sulfonated tetrafluoroethylene based fluoropolymer-copolymer) membranes to be tested in a proton exchange membrane fuel cell ("PEMFC") with the goal to increase energy production. Au-graphene and platinum-graphene increased power output of the PEMFC. Au-graphene increased power output by 150% over plain NAFION® and, per milligram of Au applied, was 18 times more effective than Au nanoparticles alone. This suggests a synergy exists between the Au and graphene that enhances the power output in a PEMFC. FIG. 1 is a transmission electron microscope ("TEM") image of a synthesized graphene sheets studded with gold nanoparticles.

The present invention is also a method for attaching reduced graphene oxide and/or graphene oxide to an exterior surface of a polymer layer used in a solar cell, preferably a poly-3-hexyl thiophene (P3HT) and phenyl-$C_{61}$-butyric acid methyl ester (PCBM) polymer blend (P3HT:PCBM) layer. The reduced graphene oxide coated polymer layers replace aluminum electrodes, which easily oxidize, to provide improved industrial production of longer-lasting, cost-effective solar cells.

As used herein, the term "homogeneous dispersion" refers to a system in which particles are dispersed in a continuous phase of a different composition and do not display any structure; i.e., the particles dispersed in the liquid or solid matrix (the "dispersion medium") are assumed to be statistically distributed. With respect to the dispersions formed herein, agglomerated particles of AuGO or AuRGO in the dispersion are separated from each other and a new interface, between an inner surface of the liquid dispersion medium and the surface of the particles to be dispersed, is generated.

As used herein, the term "Proton Exchange Membrane Fuel Cells" ("PEMFC"), refers to a fuel cell that transforms the chemical energy liberated during the electrochemical reaction of hydrogen and oxygen to electrical energy, as opposed to the direct combustion of hydrogen and oxygen gases to produce thermal energy.

As used herein, the term "weight ratio" refers to the amounts of each component in the composition as a ratio of the weight of each component. For example, if the composition contained 0.5 mg of RGO, 20 mg of PSS, 20 mg of P3HT and 20 mg of PCBM, the weight ratio of the components in the composition would be 0.5:20:20:20. In another example, if the composition contained 20 mg of a GO/PSS dispersion, 20 mg of P3HT and 20 mg of PCBM, the weight ratio of the components in the composition would be 20:20:20.

As used herein, the terms metal-GO and metal-RGO refer to graphene oxide (GO) or reduced graphene oxide (RGO), respectively, that is functionalized by a metal, preferably gold (Au), platinum (Pt), palladium (Pd) or ferric oxide ($Fe_2O_3$).

As used herein, the terms "reduced graphene oxide" (RGO) and "chemically derived graphene" (CDG) refer to a material resulting from chemical exfoliation of graphite.

As used herein, the term "ultraviolet/ozone" ("UV/$O_3$") exposure refers to a method for altering the polymer chains on the surface of a polymer. The UV/$O_3$ exposure creates free radicals which oxidize the surface region rendering it polar and hydrophilic. The UV/$O_3$ exposure also etches the surface of the polymer and can produce roughness. Therefore, the optimal UV/$O_3$ treatment lasts for only the minimum amount of time required to etch a few nanometers and chemically oxidize the surface.

As used herein, the term "hydrophobic polymer" refers to a polymer that repels, tends not to combine with, or is incapable of dissolving in water. Characteristics of hydrophobic polymer surfaces are high contact angle with a water droplet, poor adhesiveness, poor wettability and low solid surface free energy.

As used herein, the term "hydrophilic polymer" refers to a polymer having an affinity for water and readily absorbed or dissolved in water. Generally, hydrophilic polymers are those polymers of chains of chemical compounds that have polar or charged functional groups, rendering them soluble in water. Characteristics of hydrophilic polymer surfaces are low contact angle, good adhesiveness, good wettability and high solid surface free energy.

As used herein, the term "contact angle" refers to the angle, conventionally measured through the liquid, where a liquid/vapor interface meets a solid surface. It quantifies the wettability of a solid surface by a liquid via the Young equation ($0=\gamma_{SG}-\gamma_{SL}-\gamma_{LG} \cos \theta_C$, wherein $\gamma_{SG}$ s the solid-vapor interfacial energy, $\gamma_{SL}$ is the solid-liquid interfacial energy, $\gamma_{LG}$ is the liquid-vapor interfacial energy (i.e., the surface tension) and $\theta_C$ is the equilibrium contact angle). A given system of solid, liquid and vapor at a given temperature and pressure has a unique equilibrium contact angle. Generally, if the water contact angle is smaller than 90°, the solid surface is considered hydrophilic and if the water contact angle is larger than 90°, the solid surface is considered hydrophobic. Many polymers exhibit hydrophobic surfaces. Highly hydrophobic surfaces made of low surface energy (e.g. fluorinated) materials may have water contact angles as high as ~120°.

As used herein, the term "spin coating" refers to a procedure used to deposit uniform thin films onto flat substrates. Usually, a small amount of coating material is applied on the center of the substrate, which is either spinning at low speed or not spinning at all. The substrate is then rotated at high speed in order to spread the coating material by centrifugal force. Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the viscosity and concentration of the solution and the solvent.

As used herein, the term "exciton" refers to a bound state of an electron and an electron hole, which are attracted to each other by the electrostatic Coulomb force. It is an electrically neutral quasiparticle that exists in insulators, semiconductors and in some liquids. The exciton is regarded as an elementary excitation of condensed matter that can transport energy without transporting net electric charge.

The present invention does not spincast a thin film of either reduced graphene oxide or regular graphene oxide, functionalized or not-functionalized with Au nanoparticles, as disclosed in the prior art. Instead, the compositions and process of the present invention incorporates either reduced graphene oxide or regular graphene oxide, functionalized or non-functionalized with Au nanoparticles, along with a third polymer (PSS or PMMA) into the P3HT-PCBM composition of the active layer. This incorporation organizes the active layer while the AuRGO provides a bridge between the electron donating and accepting materials, allowing for a more efficient, less interrupted flow of electrons, thereby increasing efficiency to a greater degree than P3HT-PCBM active layers in the prior art.

Figure 2:
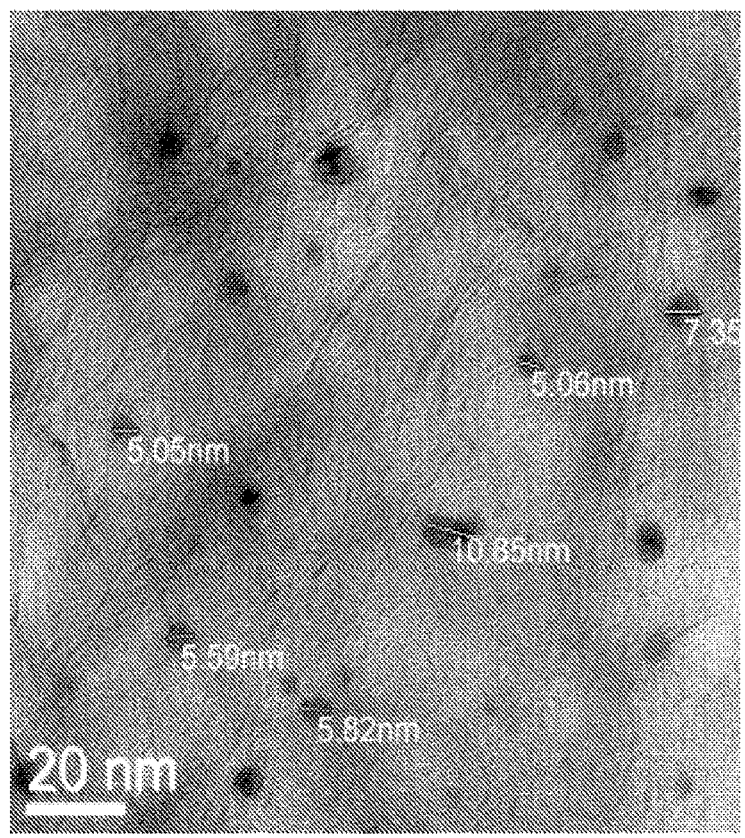
FIG. 2 is a TEM image of gold nanoparticles incorporated onto a GO sheet.

The present invention is for compositions and a method for making compositions that are used in the active layer of a solar cell or a fuel cell. The compositions include graphene oxide or reduced graphene oxide. In a preferred embodiment, the graphene oxide is functionalized and converted into metallized graphene by mixing metal salts with graphene oxide in an ethanol-water solvent and then reducing with sodium borohydride. FIG. 2 is a TEM image of GO with gold nanoparticles that range in size between ~5-10 nm. Gold and platinum salts react with the GO while they stir overnight and are at least partially reduced as they are incorporated onto the GO sheets. The metal-GO is then reduced with sodium borohydride to form metallized graphene, which is then added to polymer materials that form the active layer of the solar cell or fuel cell.

One of the problems encountered, when creating a thin film for the active layer of a PSC from an accepting/donating polymer blend, is that the polymer phase separates, causing the morphology of bulk heterojunction solar cells to be a disorderly mix of electron-accepting and electron-donating polymers. Phase separation reduces the amount of interfaces in which excitons can dissociate and this random network of donor and acceptor materials inhibits the ability of the separated charge carriers from reaching their respective electrodes. Instead, the electron or hole may recombine with its opposite charge in a process called bimolecular recombination. Improved organization of the active layer increases charge transport and prevents recombination by allowing the mobile charge carriers to reach the electrodes without having to navigate through a network of accepting/donating materials. The incorporation of a third polymer such as polystyrene (PS) has been shown to create an ordered columnar arrangement, forming a direct path through which the charges can flow.

The homogeneous dispersion includes graphene, GO or RGO or metal-functionalized graphene, GO or RGO and a polymer that is not miscible with the photoactive moiety of the active cell, P3HT. The immiscibility of the polymer leads to the formation of phase segregated columns in the active layer of a solar cell or fuel cell. Many of the polymers that are not miscible with P3HT are immiscible because of their high molecular weight, which reduces their effective entropy of mixing. The polymers used in the homogeneous dispersion include styrenic polymers, acrylic polymers, carbonates, olephins and polyelectrolyte. The term styrenic polymer is used to describe a family of major plastic products that use styrene as their key building block. Included in this family of products are: polystyrene, sulfonated polystyrene, expandable polystyrene, acrylonitrile butadiene styrene copolymer, styrene acrylonitrile copolymer unsaturated polyester resins and styrene butadiene rubber. Acrylate polymers belong to a group of polymers commonly known as acrylics or polyacrylates, such as PMMA, polymethyl methacrylate, polyacrylamide copolymer. Polyelectrolytes are polymers whose repeating units bear an electrolyte group, such as sulfonated polymers. The preferred polymers in the dispersions are PMMA and PSS.

In the field of polymer-based photovoltaic cells, poly(3-hexylthiophene) (P3HT) and 1-(3-methoxycarbonyl)propyl-1-phenyl[6,6]$C_{61}$ (PCBM) are two of the most widely used active materials for inclusion in compositions that form the bulk-heterojunction structure. Various power-conversion efficiencies have been reported up to approximately 5%. The present invention improves the power-conversion efficiencies of P3HT-PCBM compositions used to form the active layer of solar cells by incorporating sulfonated polystyrene ("PSS") and graphene oxide or reduced graphene oxide in the compositions. The reduced graphene oxide can be functionalized with metal nano-particles, preferably gold or platinum particles. The P3HT is preferably high molecular weight, ultra-high purity P3HT.

In the active layers formed from the compositions of the present invention, the P3HT arranges itself into a parallel alignment while the PCBM shapes the structure into nano-columns, allowing more efficient exciton dissociation in conjunction with the improved charge transport. Partially sulfonated polystyrene ("PSP"), e.g., 0.85% sulfonated polystyrene ("PSS"), is miscible with both P3HT and PCBM and reduces interfacial tension between the P3HT and PCBM, resulting in a more organized nanoscale morphology. Adding both AuRGO and PSS to the compositions that form the active layers increases the efficiency even more. PSS increases the organization of the nanoscale morphology in the active layer. The organization is further increased with the addition of AuRGO. Gold has a strong affinity for sulfur. The gold nanoparticles on the graphene are believed to attach to both the sulfur group on PSS and the sulfur group on P3HT. This results in electronic interactions between the materials by acting as a bridge between them.

Figure 3:
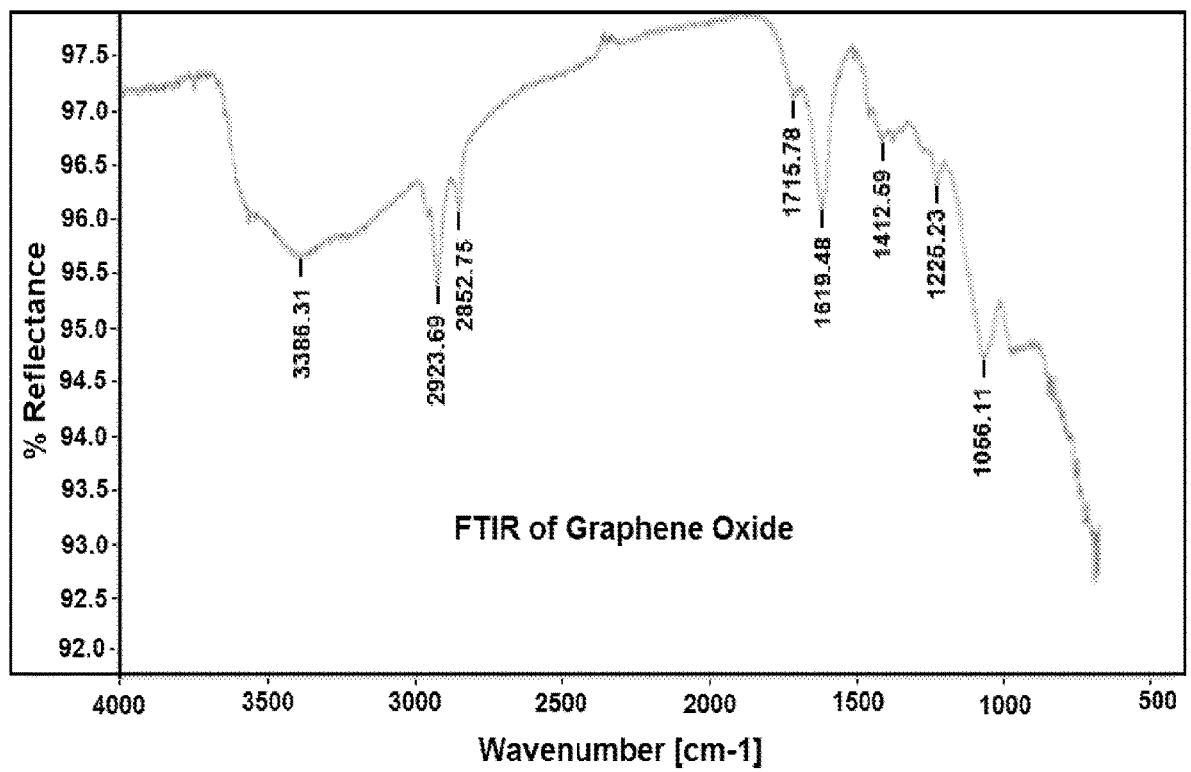
FIG. 3 is a graph generated using Fourier transform infrared imaging of graphene oxide with its characteristic functional groups.
Figure 4:
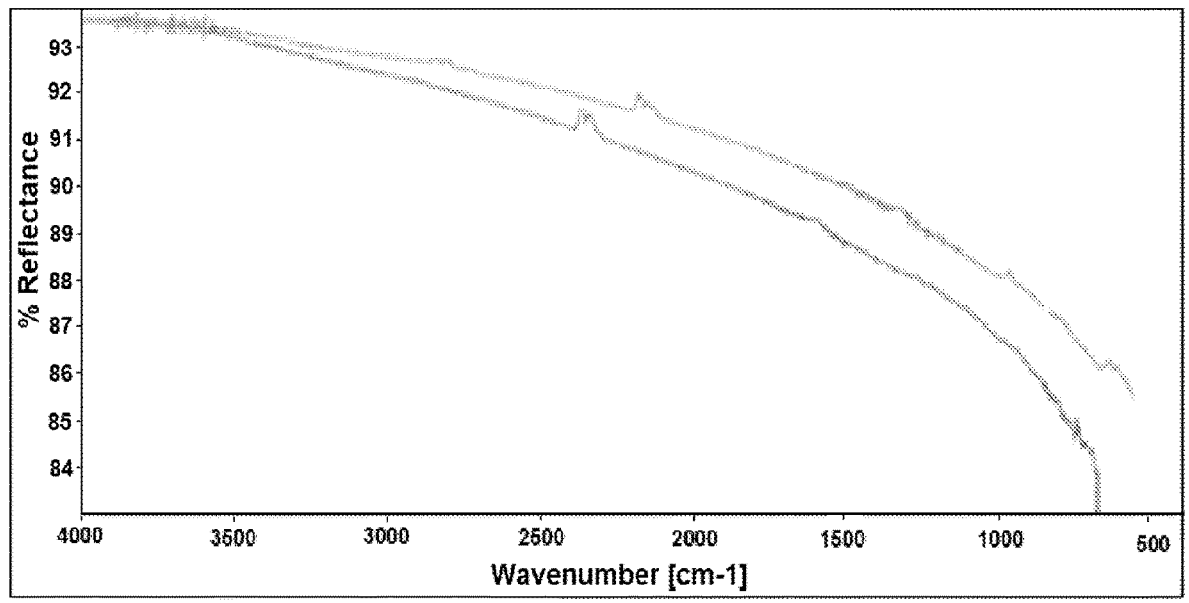
FIG. 4 is a graph generated using Fourier transform infrared imaging of RGO with $KAuCl_4$ and $K_2PtCl_4$.

Referring now to the drawings, the Fourier transform infrared ("FTIR") spectroscopy image in FIG. 3 shows graphene oxide ("GO") with different functional groups, and nearly complete reduction of metallized graphene oxide showing absence of functional groups is seen in FIG. 4. The GO spectra shows the characteristic peaks at about 1720 $cm^{-1}$ (stretching from C=O), about 1600 $cm^{-1}$ (skeletal vibrations from non-oxidized graphite), about 1220 $cm^{-1}$ (C—OH stretching vibrations) and at about 1060 $cm^{-1}$ (C—O stretching vibrations). FIG. 4 shows a FTIR spectroscopy image of RGO with $KAuCl_4$ (upper curve) and RGO with $K_2PtCl_4$ (lower curve), both of which were reduced in 25% EtOH/75% $H_2O$ with sodium borohydride. The images show no significant peaks on either curve, suggesting that the reduction process of GO combined with gold or platinum salts resulted in almost pristine RGO, stripped of GO functional groups.

Figure 5:
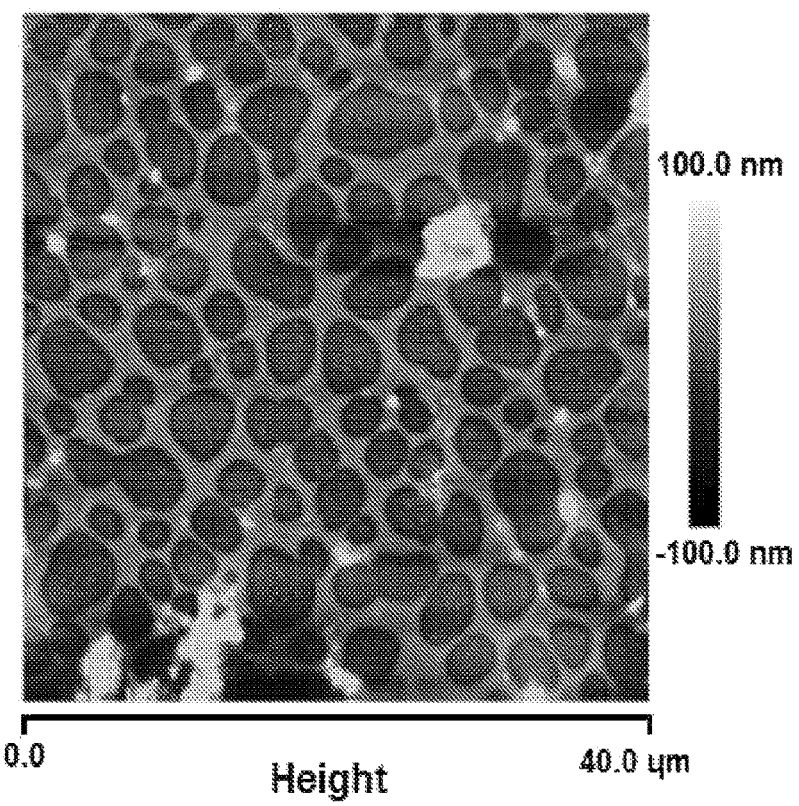
FIG. 5 is an Atomic Force Microscopy ("AFM") topography image of PSS+Au-graphene+P3HT+PCBM.
Figure 6:
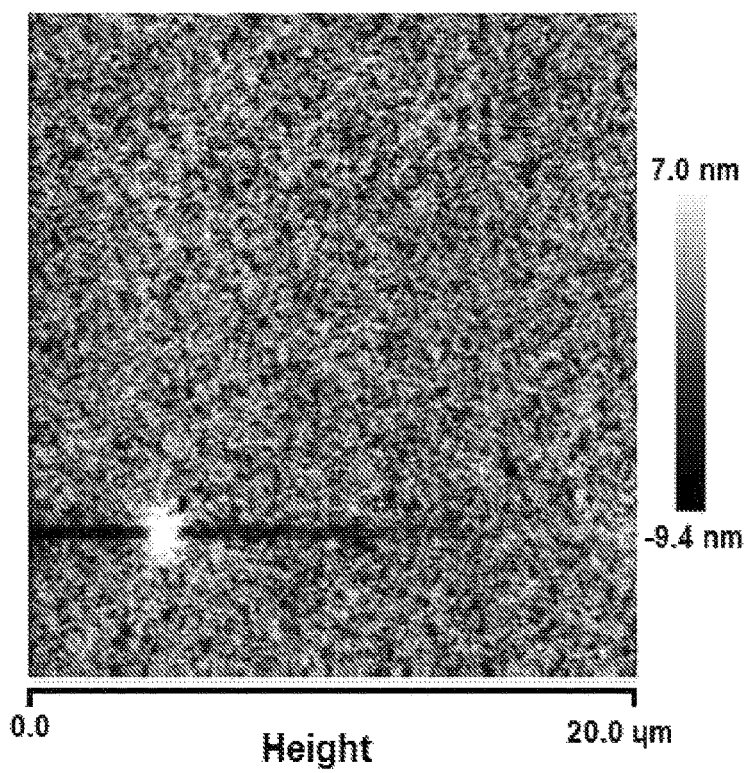
FIG. 6 is an Atomic Force Microscopy ("AFM") topography image of PSS+Au-RGO+P3HT+PCBM.
Figure 7:
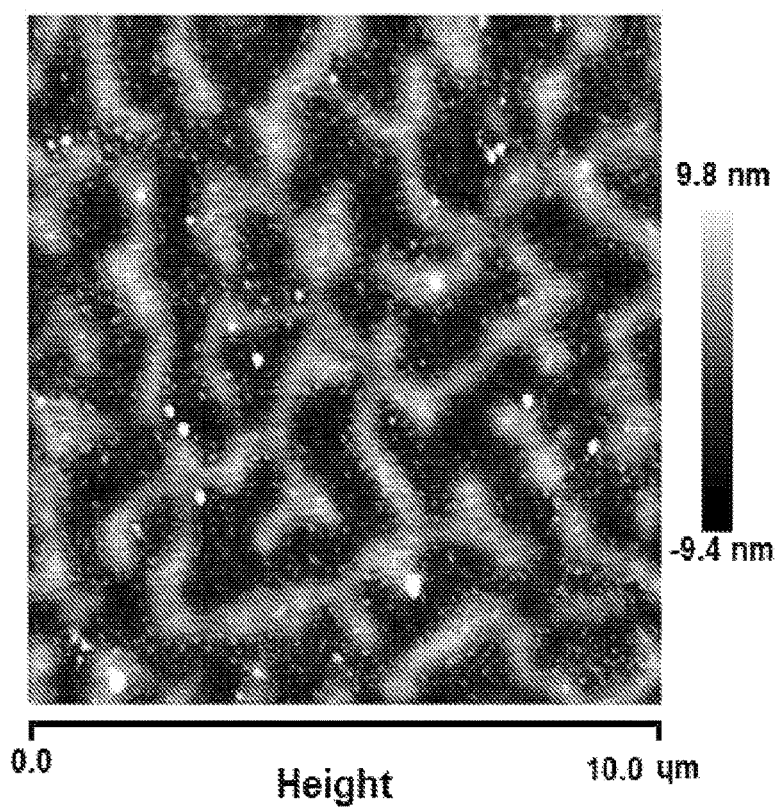
FIG. 7 is an Atomic Force Microscopy ("AFM") topography image of PSS+Au-RGO+P3HT+PCBM.

The Au-graphene+sulfonated polystyrene incorporated into the active layer of P3HT form channels in the active layer of the solar cell, where the polymers phase-separate. FIG. 5 shows the Atomic Force Microscopy ("AFM") Topography image of a film formed from a composition containing 10 mg polystyrene sulfonate ("PSS")+0.5 mg Au-graphene+10 mg P3HT+10 mg PCBM. FIGS. 6 and 7 show AFM images of a film formed from a composition containing 10 mg polystyrene sulfonate ("PSS")+0.5 mg Au-RGO+10 mg P3HT+10 mg PCBM. The images of the thin films in FIGS. 5-7 show clear phase-separation; the polymers have self-assembled into column-like structures. The white areas represent sheets of graphene. The sheets of graphene are at the interface of the phases, which promotes exciton dissociation and transport. The AuRGO shows an affinity for both materials, migrating to the interfaces.

Figure 8:
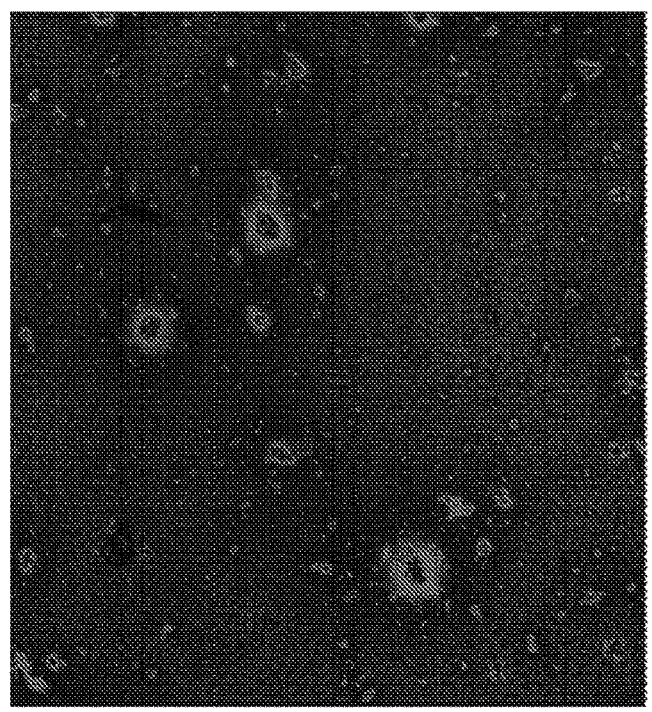
FIG. 8 is a confocal microscope image of PSS+Au-graphene+P3HT+PCBM.

FIG. 8 shows confocal microscope image of PSS+Au-graphene+P3HT+PCBM with the dispersion of AuRGO throughout the mixed polymers.

The addition of Au-graphene to the P3HT:PCBM:PSS composition used to form the active layer of a solar cell or fuel cell increased the solar cell efficiency more than P3HT:PCBM:PSS compositions without Au-graphene.

Figure 9:
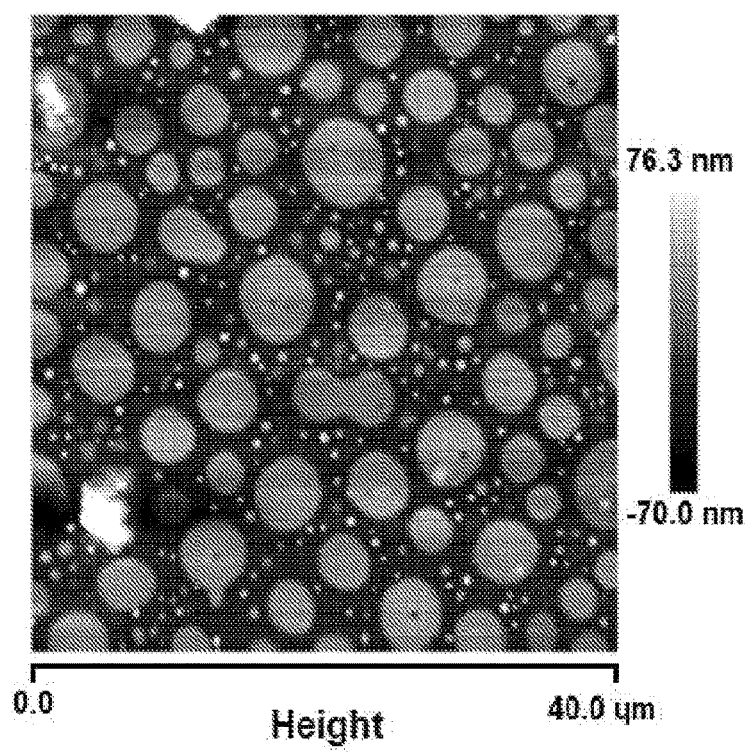
FIG. 9 is an AFM Topography Image of PMMA+Graphene+P3HT+PCBM.

It was found that regular graphene dispersed in para-Methoxy-N-methylamphetamine ("PMMA") also formed channels and phase-separated in the active layer of P3HT:PCBM. FIG. 9 shows the AFM Topography image a film formed from a composition containing 10 mg PMMA+0.5 mg cG+10 mg P3HT+10 mg PCBM. The commercial graphene ("cG") with P3HT and PMMA thin film shows clear phase-separation, as evidenced by the varying thickness measures on the surface of the wafer; the polymers self-assembled into column-like structures. While the commercial graphene did not disperse perfectly throughout, showing some areas of large aggregates, it did disperse evenly for the most part. In addition, it was found that graphene added to PMMA in the active layer increased solar cell efficiency more than without graphene.

Figure 10:
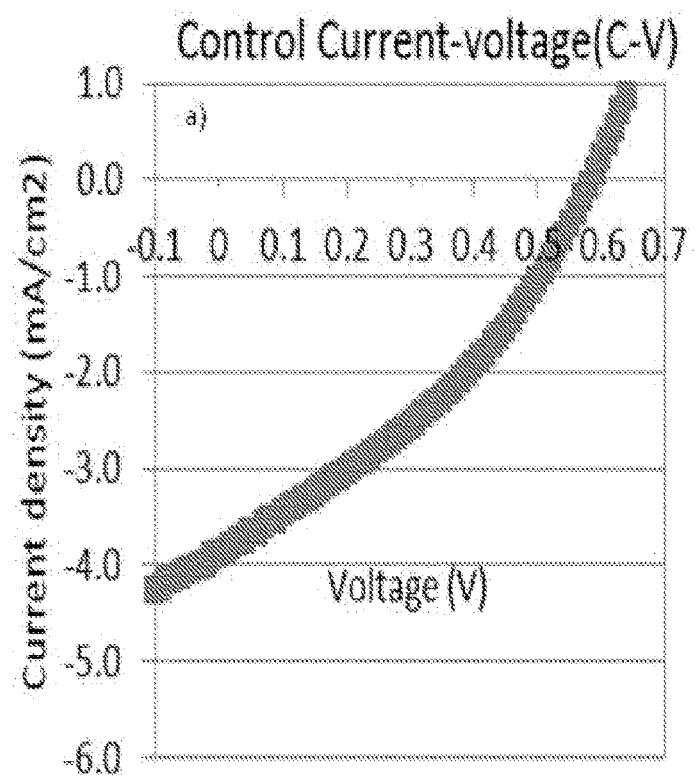
FIG. 10 shows a C-V curve that is used to determine efficiency.
Figure 11:
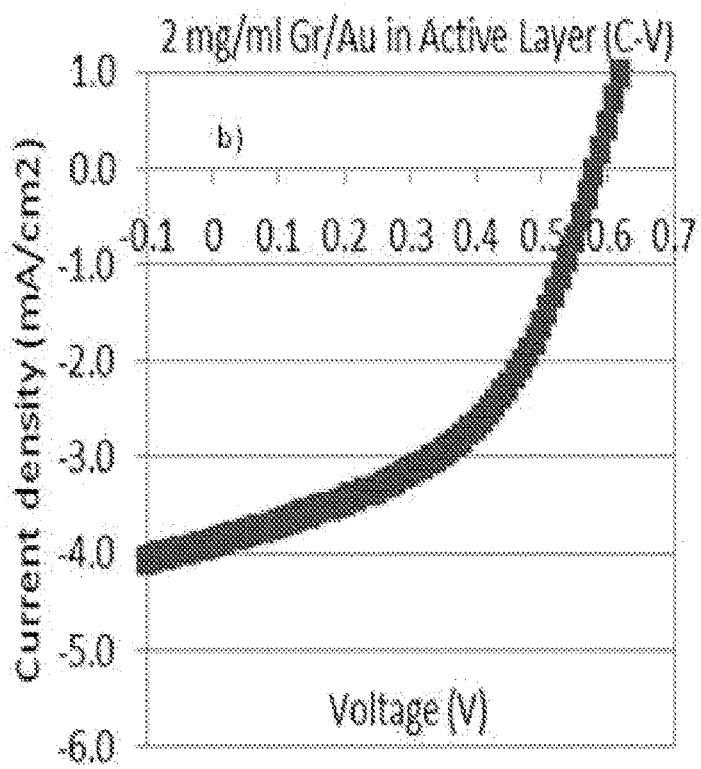
FIG. 11 shows a C-V curve that is used to determine efficiency.

Graphene and metal-graphene composites added to the binary active layer of the solar cell without the incorporation of an additional polymer also significantly increased the performance of the OPSC. FIGS. 10 and 11 show C-V curves that are used to determine efficiency. In order to evaluate the performance of photovoltaic devices, current-voltage measurements are performed both in dark and under illumination under standardized testing conditions such as temperature (25° C.), light intensity (1000 W/m$^2$), and the spectral distribution of light (air mass 1.5 or AM 1.5, which is the spectrum of sunlight after passing through 1.5 times the thickness of the atmosphere). The power conversion efficiency of the solar cell is determined by the equation, $$X = \frac{Jsc * Voc * FF}{I},$$

where Jsc is the short-circuit current density, Voc is the maximum voltage when the current density is at zero, FF is the fill factor which is defined as the ratio between the maximum power that can be drawn from the device and the product of the open-circuit voltage ("Voc") and short-circuit current ("Jsc"), and I is the irradiance.

Figure 12:
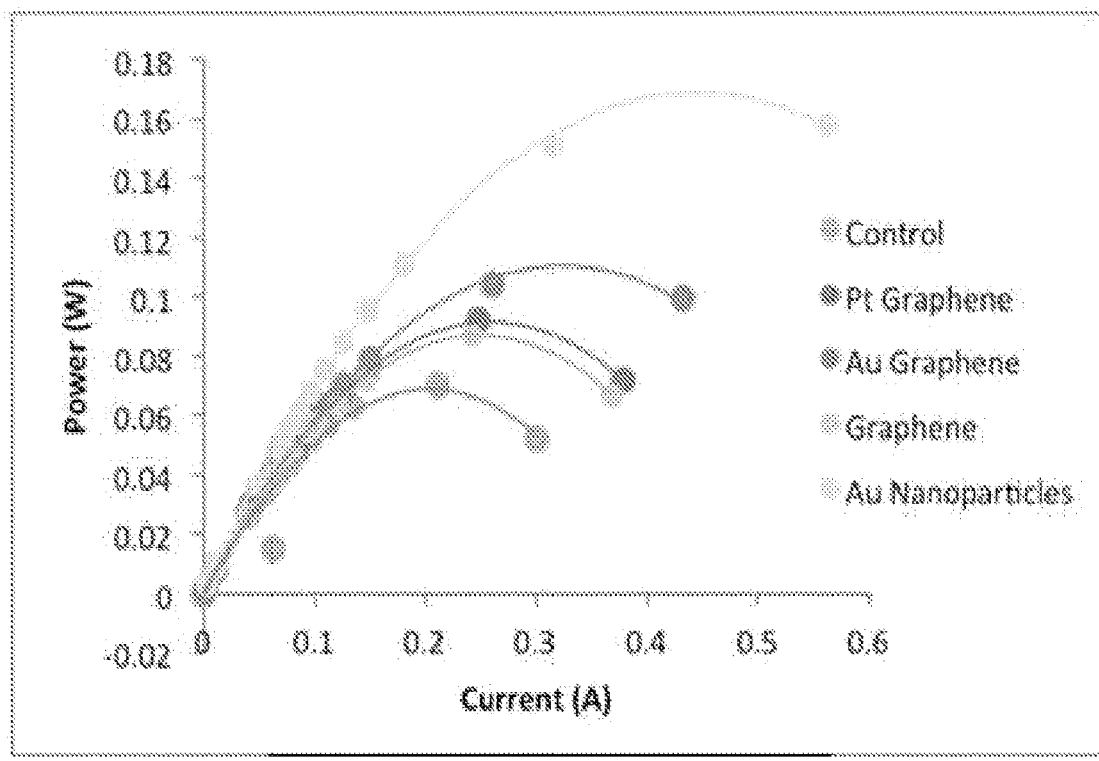
FIG. 12 is a graph showing power-current curves for graphene and various metal functionalized graphenes.

In a Proton Exchange Membrane Fuel Cell ("PEMFC"), Au-graphene and platinum-graphene increased power output of the NAFION® membrane. Au-graphene increased power output by 150% over plain NAFION® and, per milligram of Au applied, was 18 times more effective than Au nanoparticles alone, suggesting a synergy exists between the Au and graphene that enhances the power output in a PEMFC. FIG. 12 shows that the Au nanoparticles performed best. However, the concentration of Au in the Au nanoparticles (1 mg/mL of a 0.25 mL solution) was higher than that of the Au-Graphene (0.05 mmolar of a 1 mL solution). The moles of Au were calculated for both solutions (molar mass of Au is 197 g), showing that the Au nanoparticles had $1.3 \times 10^{-6}$ moles and the Au-Graphene had $5 \times 10^{-8}$ moles of Au.

$$\text{Au Nanoparticles:} \quad 0.25 \times 10^{-3} \text{ g Au} \times \frac{1 \text{ mol}}{197 \text{ g}} = 1.3 \times 10^{-6} \text{ mol Au}$$

$$\text{Au-Graphene:} \quad 0.05 \text{ mmolar} = \frac{0.05 \times 10^{-3} \text{mol}}{1000 \text{ mL}} = \frac{5 \times 10^{-3} \text{mol Au}}{1 \text{ mL}}$$

This indicates that amount of Au in the Au nanoparticles is 26 times greater than in the Au-graphene. If compared at a resistance of 1, the bare NAFION® membrane produced 0.070 watts of power; the Au nanoparticles produced 0.151 watts, and the Au-graphene provided 0.104 watts, 1.5 times better than NAFION® alone. Furthermore, if the Au-Graphene were to be scaled to have the same amount of Au nanoparticles, it would produce 26 times more power: 2.71 watts of power. This means that, if performed at the same concentrations of Au, the Au-Graphene would be 18 times more effective than Au-nanoparticles alone.

Atomic Force Microscopy of the AuRGO with P3HT and PSS thin film shows clear phase-separation; the polymers have self-assembled into column-like structures. The white areas represent sheets of graphene located at the interface of the phases, which promote exciton dissociation and transport. As disclosed in Example 6, testing with solar simulation showed that the AuRGO configuration outperformed all other configurations in all regards. The AuRGO sample experienced a 480% efficiency increase when compared to its control. For the other sample of AuRGO, P3HT and PSS, morphology testing again showed clear self-assembly into column structures seen with the AFM images. The AFM images of this layer showed the AuRGO migrating to the interfaces, showing an affinity for both the P3HT and PSS. The AuRGO is believed to act as a bridge between the two materials, allowing for more efficient electronic interactions between the two.

Tests were also conducted with commercially-produced graphene ("cG"), incorporated with PMMA instead of PSS into the P3HT-PCBM active layer. The cG+P3HT+PMMA AFM images show very good self-organization into column structures. This also increased PCE by more than 600% over its control. See Example 6. However, the greatest PCE was achieved using Au-RGO with PSS.

Figure 19:
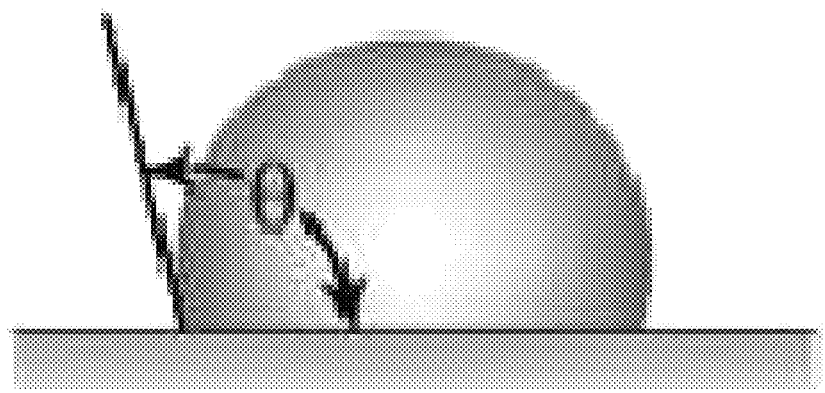
FIG. 19 shows a water droplet on a hydrophobic surface and the contact angle, θ.
Figure 20:
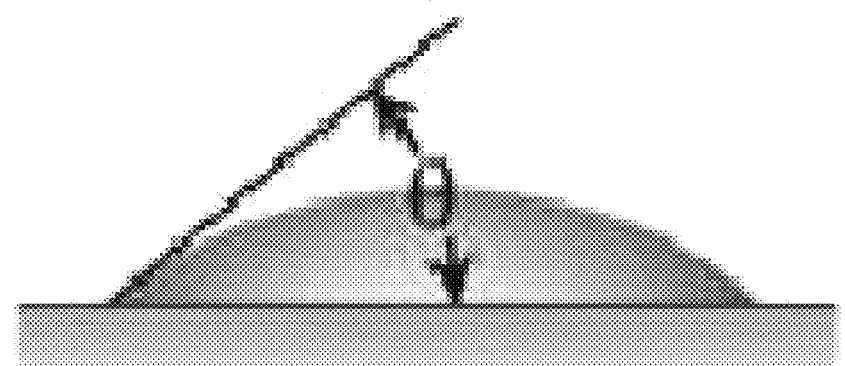
FIG. 20 shows a water droplet on a hydrophilic surface and the contact angle, θ.
Figure 21:
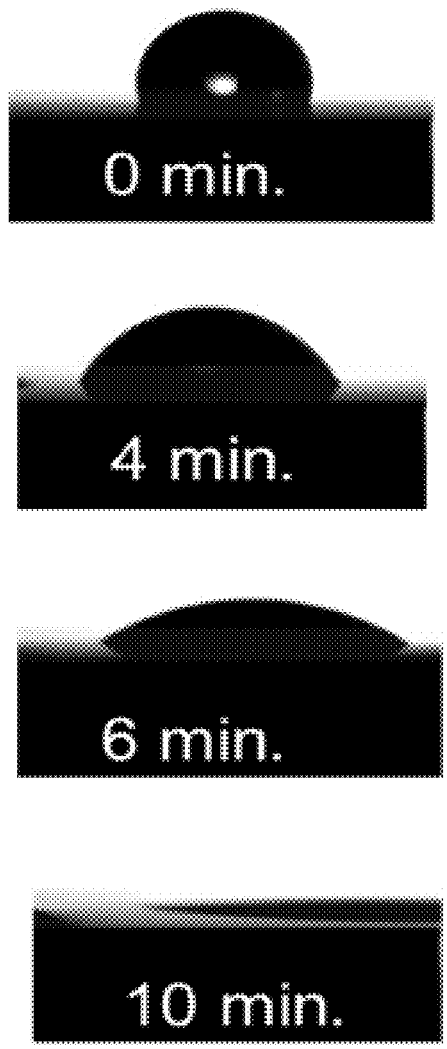
FIG. 21 shows a water droplet on a hydrophobic surface over time from 0 to 10 minutes as the surface is exposed to $UV/O_3$.

The effectiveness of the UV/ozone exposure is evidenced by the contact angle goniometry, which is a measure of the water contact angle with the surface and hence the degree of hydrophilicity. In this technique, complete wetting by water over the polymer surface is demonstrated by zero value for the contact angle, and values above 90 degrees are considered hydrophobic. See FIGS. 19 and 20, which show a water droplet on a hydrophobic surface and a water droplet on a hydrophilic surface, respectively, and the contact angle, θ. FIG. 21 illustrates how the contact angle of a water droplet on a hydrophobic thin film decreases with increasing UV/ozone exposure over time (from an untreated polymer at 0 minutes to a treated polymer at 10 minutes), completely wetting the surface after 10 minutes of exposure time.

Using the method of the present invention decreases the surface contact angle from an initial hydrophobic value of greater than 70°, preferably more than 80°, more preferably greater than 90°, and in some cases greater than 100° to a much smaller value of less than 70°, preferably less than 50° and most preferably less than 40°. After exposing the polymer surface to UV/ozone for anywhere from 30 seconds to one hour, preferably from 1 to 20 minutes, more preferably from 5 to 10 minutes and most preferably about 7 to 8 minutes, the surface can be easily wetted with the reduced graphene oxide solution. The ability to wet the polymer surface indicates that the surface has become hydrophilic.

The GO can be formed using a modified Hummers method as disclosed in U.S. Patent Pub. No. US A1 2011/0281035, which is incorporated herein in its entirety. Other well-known methods for forming GO can also be used. The GO is then suspended in an alcohol-water solvent and reduced using NaBH4 as a reductant. Unreduced graphene oxide can also be used either alone or together with the reduced graphene oxide. The preferred ratio of alcohol to water in the solvent is 10 vol. % alcohol to 90 vol. % water, more preferably 25 vol. % alcohol to 75 vol. % water. Other solvents that can be used are water, ethanol, ethanol-water mixtures, and dilute NaOH solutions. Gold-nanoparticles can be added to the suspension to create a gold-nanoparticle functionalized graphene by dissolving a concentration of 0.05 mmolar $AuCl_4$ in GO suspended in 10 vol. % ethanol to 90 vol. % ethanol (preferably 50 vol. % ethanol to 50 vol. % $H_2O$, more preferably 25 vol. % ethanol to 75 vol. % water) and allow this to stir overnight. Preferably, deionized water is used. The mixture is then reduced by adding $NaBH_4$, preferably enough $NaBH_4$ is added so that the mixture has a 15 mmolar concentration $NaBH_4$. The addition of $NaBH_4$ immediately turns the solution black. The mixture is then stirred from 4 to 16 hours, preferably from 8 to 12 hours to allow an Au-graphene precipitate to form. The precipitate is dried in a vacuum oven to form a dried powder, which can be mixed with a solvent and spin cast onto a solar cell active polymer layer that has been treated with UV/ozone to make it compatible with a hydrophilic solvent. If the $NaBH_4$ reduction is not fully completed and a precipitate does not form, the solution can be used directly for spin casting onto the solar cell active polymer layer.

The polymer layer initially has a hydrophobic exterior surface and it is difficult to apply the RGO solvent or suspension to it. Preferably, the polymer is a poly-3-hexyl thiophene (P3HT) and phenyl-$C_{61}$-butyric acid methyl ester blend (P3HT:PCBM). After exposure to UV/$O_3$, the exterior surface of the polymer layer becomes hydrophilic and the RGO solvent or suspension readily adheres to the surface. Tests showed that spin coating the RGO suspension onto the UV/$O_3$ modified polymer surface caused increased adhesion to the point where longer spinning time was required to evaporate the solvent from the surface.

The ultraviolet/ozone (UV/$O_3$) exposure can be provided by different UV/$O_3$ generators that are well known to those skilled in the art and commercially available. For example, ultraviolet lamps are frequently used to generate ozone. A UV lamp emits UV light at 185 nanometers (nm). Air (usually ambient air) is passed over an ultraviolet lamp, which splits oxygen ($O_2$) molecules in the gas. The resulting oxygen atoms ($O^-$), seeking stability, attach to other oxygen molecules ($O_2$), forming ozone ($O_3$). The polymer surface is exposed to the ozone for a time sufficient to change the exterior surface from hydrophobic to hydrophilic. Longer exposure and greater concentrations of $O_3$ result in the polymer surface becoming more hydrophilic.

EXAMPLES

The examples set forth below serve to provide further appreciation of the invention but are not meant in any way to restrict the scope of the invention.

Example 1

Figure 13:
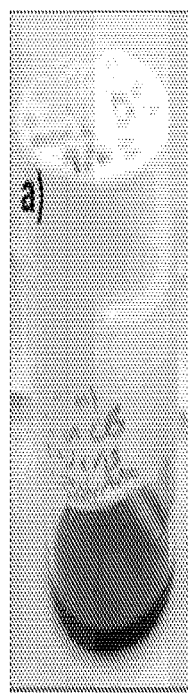
FIG. 13 is a photograph of gold-graphene particles that are homogeneously dispersed in sulfonated polystyrene dissolved in chlorobenzene.

In this experiment, Au-graphene was incorporated into the composition that forms the active layer of the OPV. $KAuCl_4$ was added to graphene oxide dissolved in 25% ethanol/75% $H_2O$ and stirred overnight, then reduced with sodium borohydride. Stirring the mixture overnight precipitated the reduced gold-functionalized graphene oxide (AuRGO), which was then centrifuged at 3600 RPM for 7 minutes. The resulting precipitate was dried in a 60° C. vacuum oven. AuRGO was added to chlorobenzene at a concentration of 0.5 mg/ml and then sonicated for 90 minutes, but this did not disperse the solute, nor did adding it to a solution of 0.85% sulfonated polystyrene (PSS) and sonicating for 90 minutes disperse the solute. The mixture of AuRGO+chlorobenzene+PSS was then stirred continuously for one week to create a homogeneous dispersion. FIG. 13 shows the gold-graphene particles that became homogeneously dispersed in sulfonated polystyrene dissolved in chlorobenzene. It is believed that the gold nanoparticles on the reduced GO bonded to the sulfur on the PSS, creating a chemical bond that solubilized the Au-RGO. P3HT (10 mg) was added to 10 mg of the homogeneous dispersion and stirred for 30 minutes. Finally, PCBM (10 mg) was added and stirred overnight to make the composition for the active layer of the OPV.

Figures 14A, 14B, 14C:
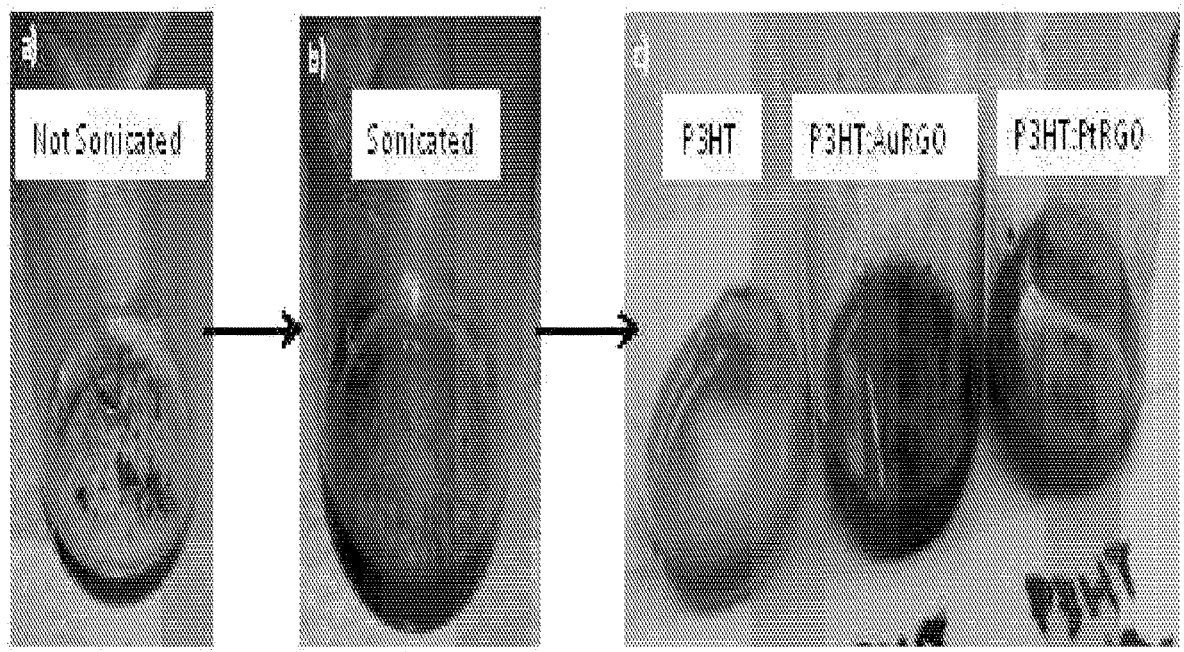
FIGS. 14A-C are photographs of vials containing AuRGO precipitate, AuRGO precipitate and chlorobenzene in a suspension and three vials P3HT and P3HT mixed with AuRGO and PtRGO.

FIG. 14A shows the AuRGO precipitate did not go into suspension after it was added to chlorobenzene. The precipitate and chlorobenzene were then sonicated and the precipitate became more finely suspended. However, particulates could still be observed within the suspension (FIG. 14B). After P3HT was added to the sonicated AuRGO precipitate and chlorobenzene, the mixture became very homogeneous and there was a distinct color change, suggesting that a chemical reaction may have occurred (FIG. 14C). P3HT is in the vial on the left in FIG. 14C and it has a bright, orange color. After the addition of AuRGO (middle vial), there is a significant color change and nearly negligible aggregation remaining, indicating a partial reaction in the presence of P3HT. The vial on the right in FIG. 14C contains a PtRGO precipitate that was mixed with chlorobenzene and sonicated, in a manner similar to the AuRGO precipitate. The PtRGO precipitate mixed with P3HT also shows a significant color change in the P3HT.

Weight ratios of 1 mg:10 mg of AuRGO:P3HT were tested to determine if graphene could act as an electron acceptor. Weight ratios of 2:20:20, 4:20:20, and 10:20:20 (measured in milligrams, mg) of AuRGO:P3HT:PCBM were tested. It was noted that the 10:20:20 mg suspension was very viscous and did not create a uniform film when spin-casted.

Example 2

In this experiment, solar simulation tests were conducted for gold functionalized reduced graphene oxide (AuRGO) and commercial graphene (cG). A first sample (Sample 1) was prepared that contained 1 mg AuRGO nanoparticles and 20 mg each of P3HT, PSS and PCBM. A second sample (Sample 2) was prepared that contained 1 mg cG nanoparticles and 20 mg each of P3HT, PMM and PCBM. In addition, a control was prepared for each sample (Control 1 and 2). The controls were the same as the first and second samples except that they did not contain AuRGO and cG, respectively.

Solar simulations of metal-RGO were compared to controls containing the third polymer (PMMA or PSS)+P3HT+

Figure 15:
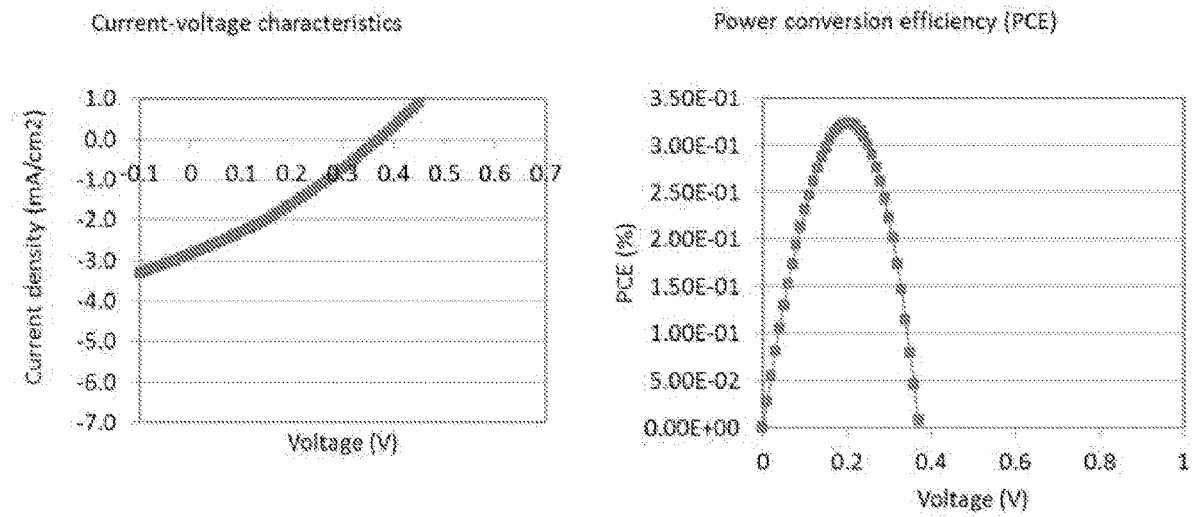
FIG. 15 shows a current-voltage characteristics graph and a power conversion efficiency graph for a composition containing AuRGO+PSS+P3HT+PCBM.
Figure 16:
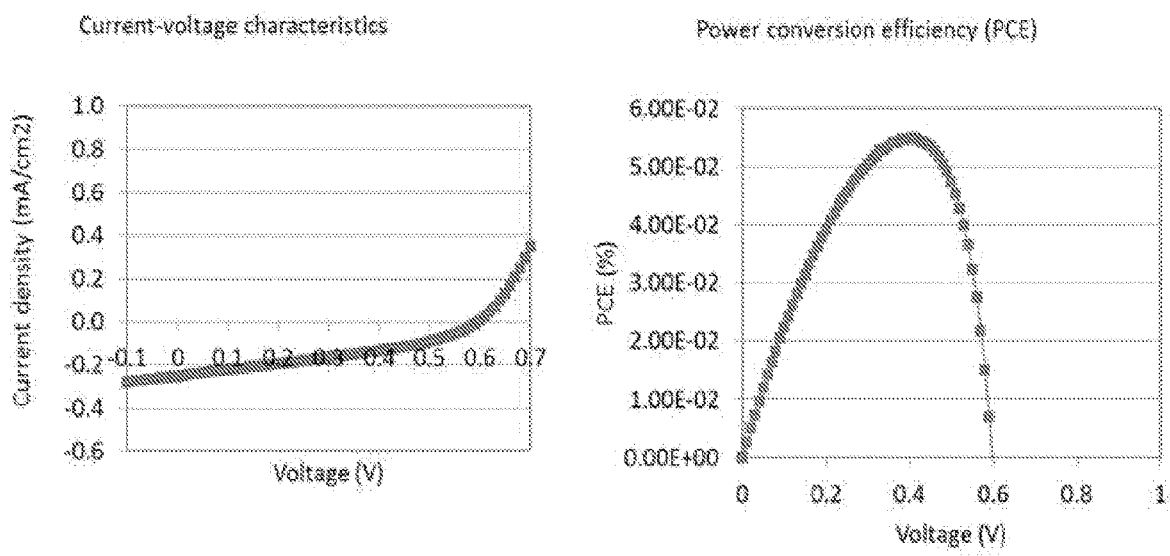
FIG. 16 shows a current-voltage characteristics graph and a power conversion efficiency graph for a control composition containing PSS+P3HT+PCBM.
Figure 17:
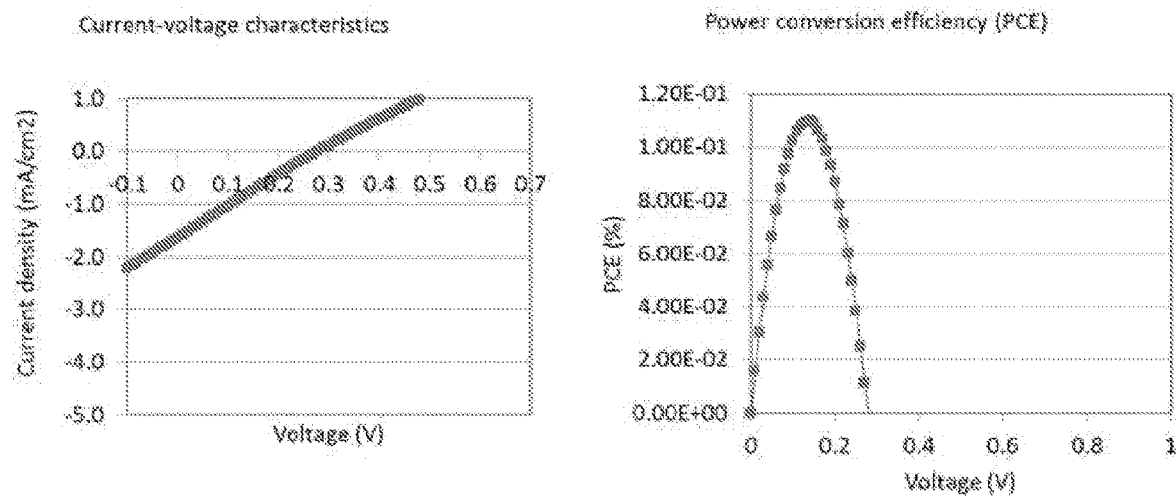
FIG. 17 shows a current-voltage characteristics graph and a power conversion efficiency graph for a composition containing cG+PMMA+P3HT+PCBM.
Figure 18:
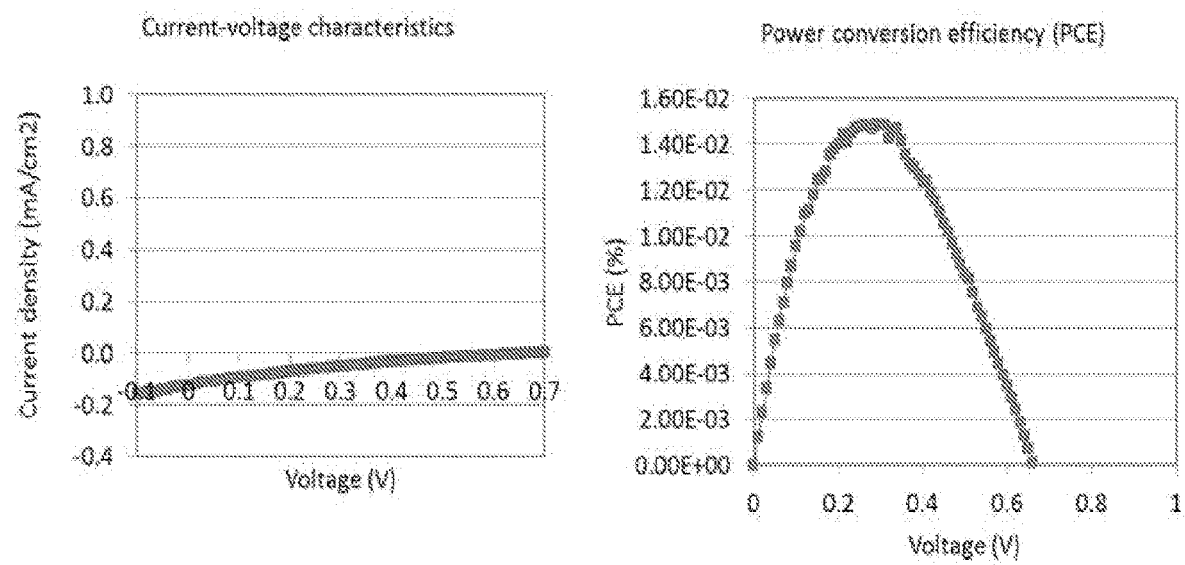
FIG. 18 shows a current-voltage characteristics graph and a power conversion efficiency graph for a control composition containing PMMA+P3HT+PCBM.

PCBM with no metal-RGO. The data that was collected was plotted on the graphs shown in FIGS. 15-18. FIG. 15 shows the results for Sample 1 (AuRGO+PSS+P3HT+PCBM), which had an average power conversion efficiency ("PCE") of 3.21 E1 and an average short circuit current ("Jsc") of 2.89. FIG. 16 shows the results for Control 1 (PSS+P3HT+PCBM), which had an average PCE of 5.51 E-2 and an average Jsc of 2.52 E-1. FIG. 17 shows the results for Sample 2 (cG+PMMA+P3HT+PCBM), which had an average PCE of 1.17 E-1 and an average Jsc of 1.78. FIG. 18 shows the results for Control 2 (PMMA+P3HT+PCBM), which had an average PCE of 1.54 E-2 and an average Jsc of 1.3 E-1. The results are summarized below in Table 1.

TABLE 1

|  | SAMPLE 1 Weight Ratio of 1:20:20:20 mg AuRGO:PSS:P3HT:PCBM | CONTROL 1 Weight Ratio of 20:20:20 mg PSS:P3HT:PCBM | SAMPLE 2 Weight Ratio of 1:20:20:20 mg cG:PMMA:P3HT:PCBM | CONTROL 2 Weight Ratio of 20:20:20 mg PMMA:P3HT:PCBM |
|---|---|---|---|---|
| Jsc (mA/cm$^2$) | 2.89 | 0.252 | 1.78 | 0.130 |
| Voc (V) | 0.355 | 0.585 | 0.258 | 0.650 |
| Fill Factor | 0.313 | 0.373 | 0.253 | 0.187 |
| PCE (%) | 0.321 | 0.0551 | 0.117 | 0.0154 |

Sample 1 with the AuRGO in the composition outperformed all other compositions in current-voltage characteristics and power conversion efficiency. However, Sample 2 with the cG in the composition had a greater percent efficiency increase when compared to its control, i.e., Control 2 (PMMA+P3HT+PCBM). The AuRGO composition (Sample 1) experienced a 480% efficiency increase when compared to its control (Control 1). The cG composition (Sample 2) experienced a 660% efficiency increase when compared to its control (Control 2).

Additional tests were performed for higher ratios of functionalized metals in graphene and unfunctionalized graphene. The tests showed that, at higher ratios (i.e., ratios above about 3:20:20:20), additional mixing was required to prevent a third phase from appearing and forming a column-like structure. This columnar structure affected the contact between the electrode and the active layer, thus skewing the results and preventing a significant reading. Significant results were obtained within the ratio range of 1-2:20:20:20. However, the tests indicated that lower ratios of metal functionalized graphene oxide (i.e., lower than 1:20:20:20 of PtRGO and AuRGO) may provide better results due to less clumping.

Example 3

Two polymer layers with a hydrophobic exterior surface were formed from a P3HT:PCBM polymer blend. A reduced graphene oxide suspension was applied by spin coating to the first layer. Tests showed that a contact angle of water on the exterior surface of the P3HT:PCBM layer was about 100 degrees. After UV/ozone exposure for seven minutes, a reduced graphene oxide suspension was applied by spin coating to the second layer. The contact angle of water was measured and found to be 38 degrees. Thus, as a result of the UV/O$_3$ exposure, the contact angle on the surface of the polymer layer was decreased from about 100 degrees to 38 degrees.

Figure 22:
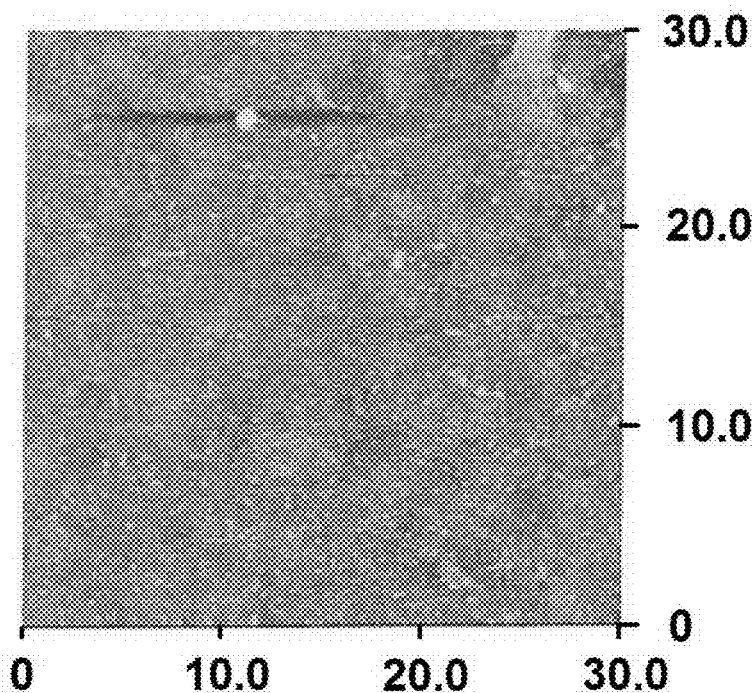
FIG. 22 is an atomic force microscope ("AFM") image of a polymer layer prior to UV/ozone exposure.
Figure 23:
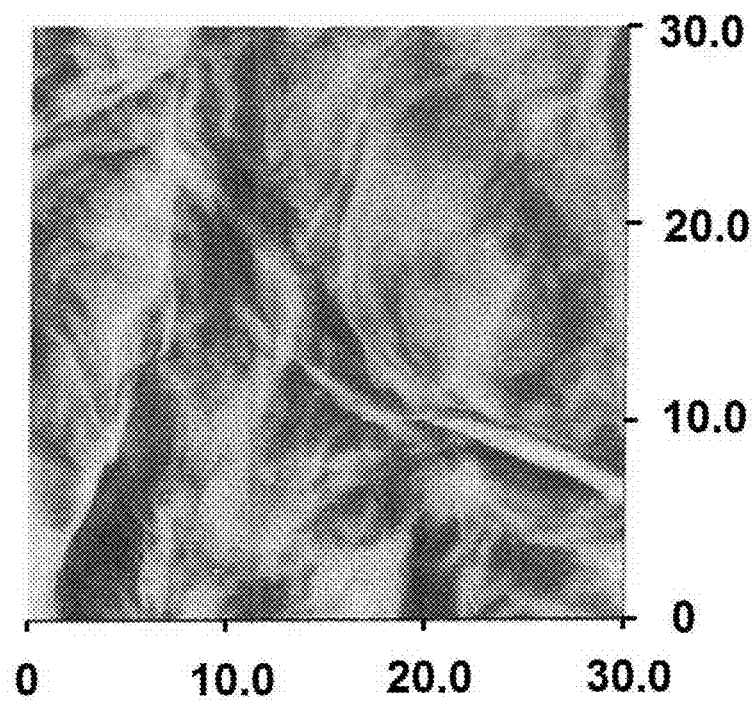
FIG. 23 is an atomic force microscope image of a polymer layer after UV/ozone exposure and the application of reduced graphene oxide by spin coating.

After the RGO was applied to the two layers by spin coating, images of the two surfaces were taken using an atomic force microscope ("AFM") as shown in FIGS. 22-23. FIG. 22 shows very little graphene adhering to the polymer without first treating the surface with UV/ozone exposure. FIG. 23 shows a layer of graphene visibly adheres to the P3HT:PCBM layer after UV/ozone exposure.

Example 4

0.05 mmolar of AuCl$_4$ was stirred in graphene oxide in a 25% ethanol/75% H$_2$O solvent overnight and then reduced with 15 mmolar NaBH4. This produced gold-naoparticle-studded graphene sheets that were characterized by transmission electron microscopy ("TEM") and Fourier transform infrared spectroscopy ("FTIR"). These gold-graphene sheets were incorporated into the active layer of an organic polymer solar cell and they were found to enhance the efficiency significantly increase the performance of the organic polymer solar cell.

Thus, while there have been described the preferred embodiments of the present invention, those skilled in the art will realize that other embodiments can be made without departing from the spirit of the invention, and it is intended to include all such further modifications and changes as come within the true scope of the claims set forth herein.

We claim:

1. A composition used to form an active layer of a solar cell or hydrogen fuel cell, the composition comprising:
    a homogeneous dispersion comprising graphene oxide (GO) or reduced graphene oxide (RGO) and a polymer that is not miscible in P3HT; and
    a polymer layer of poly(3-hexylthiophene-2,5-diyl) (P3HT) and 1-(3-methoxycarbonyl)propyl-1-phenyl[6,6]C$_{61}$ (PCBM), wherein the polymer layer is treated by ultraviolet/ozone (UV/O$_3$) exposure to form a hydrophilic, exterior surface,
    wherein the homogeneous dispersion is disposed onto the hydrophilic, exterior surface of the polymer layer.
2. The composition according to claim 1, wherein the GO or RGO is functionalized with gold (Au), platinum (Pt), palladium (Pd) or ferric oxide (Fe$_2$O$_3$).
3. The composition according to claim 1, wherein the polymer that is not miscible with P3HT is a styrenic polymer, an acrylic polymer, a carbonate, an olephin or a polyelectrolyte.
4. The composition according to claim 1, wherein the weight ratio of GO or RGO to polymer that is not miscible in P3HT in the homogeneous dispersion is from 0.5:20 to 4:20.
5. The composition according to claim 4, wherein the GO or RGO is functionalized with gold (Au), platinum (Pt), palladium (Pd) or ferric oxide (Fe$_2$O$_3$).
6. The composition according to claim 1, wherein the weight ratio of GO or RGO to P3HT and PCBM in the composition is from 0.5:20:20 to 4:20:20.
7. The composition according to claim 1, wherein the composition comprises about 25-40 wt. % homogeneous dispersion, wherein the wt. % is based on the total weight of homogeneous dispersion, P3HT and PCBM in the composition.

8. The composition according to claim 1, wherein the composition comprises 25-40 wt. % P3HT and 25-40 wt. % PCBM, wherein the wt. % is based on the total weight of homogeneous dispersion, P3HT and PCBM in the composition.

9. A composition used to form an active layer of a solar cell or hydrogen fuel cell, the composition comprising:
- a homogeneous dispersion comprising graphene oxide (GO) or reduced graphene oxide (RGO) and sulfonated polystyrene (PSS) or para-methoxy-N-methylamphetamine (PMMA); and
- a polymer layer of poly(3-hexylthiophene-2,5-diyl) (P3HT) and 1-(3-methoxycarbonyl)propyl-1-phenyl[6,6]$C_{61}$ (PCBM), wherein the polymer layer is treated by ultraviolet/ozone (UV/$O_3$) exposure to form a hydrophilic, exterior surface, wherein the homogeneous dispersion is disposed onto the hydrophilic, exterior surface of the polymer layer.

10. The composition according to claim 9, wherein the GO or RGO is functionalized with gold (Au), platinum (Pt), palladium (Pd) or ferric oxide ($Fe_2O_3$).

11. The composition according to claim 9, wherein the ratio of GO or RGO to PSS or PMMA in the homogeneous dispersion is from 0.5:20 to 4:20.

12. The composition according to claim 11, wherein the GO or RGO is functionalized with gold (Au), platinum (Pt), palladium (Pd) or ferric oxide ($Fe_2O_3$).

13. The composition according to claim 9, wherein the ratio of GO or RGO to P3HT and PCBM in the composition is from 0.5:20:20 to 4:20:20.

14. The composition according to claim 9, wherein the composition comprises about 25-40 wt. % P3HT, wherein the wt. % is based on the total weight of PSS or PMMA, P3HT and PCBM in the composition.

15. The composition according to claim 9, wherein the composition comprises about 25-40 wt. % P3HT and about 25-40 wt. % PCBM, wherein the wt. % is based on the total weight of PSS or PMMA, P3HT and PCBM in the composition.

* * * * *